United States Patent [19]

Moroni

[11] Patent Number: 5,579,005
[45] Date of Patent: Nov. 26, 1996

[54] DIGITAL CORRECTION FOR MISSING CODES CAUSED BY CAPACITIVE MISMATCHINGS IN SUCCESSIVE APPROXIMATION ANALOG-TO-DIGITAL CONVERTERS

[75] Inventor: Angelo Moroni, Villanova del Sillaro, Italy

[73] Assignee: SGS-Thomson Microelectronics, S.r.l., Agrate Brianza, Italy

[21] Appl. No.: 356,075

[22] Filed: Dec. 14, 1994

[30] Foreign Application Priority Data

Dec. 15, 1993 [EP] European Pat. Off. .............. 93830503

[51] Int. Cl.$^6$ ................................................. H03M 1/06
[52] U.S. Cl. ............................................ 341/155; 341/118
[58] Field of Search ...................................... 341/155, 120, 341/121, 118, 156, 159

[56] References Cited

U.S. PATENT DOCUMENTS

| | | |
|---|---|---|
| 3,775,747 | 11/1973 | Gabriel et al. . |
| 3,891,984 | 6/1975 | Kerwin et al. . |
| 4,641,129 | 2/1987 | Doluca et al. ......................... 341/121 |
| 5,218,362 | 6/1993 | Mayes et al. ......................... 341/121 |

FOREIGN PATENT DOCUMENTS

| | | |
|---|---|---|
| 0540117 | 5/1993 | European Pat. Off. . |
| 2349239 | 11/1977 | France . |

*Primary Examiner*—Brian K. Young
*Attorney, Agent, or Firm*—Robert Groover; Betty Formby; Matthew Anderson

[57] ABSTRACT

An analog-to-digital converter (ADC), comprising an internal digital-to-analog converter (DAC), driven by a successive approximation register (SAR), and a comparator, is provided with a correction logic circuit that controls the execution of a verifying and correcting routine at the end of each conversion routine. Master-Slave cells that compose the SAR are provided with a dedicated circuitry, responding to said correction control circuit, for confirming, incrementing or decrementing the bit stored in the cell by at least an LSB. An extremely simple routine, performed at the end of each conversion cycle, allows correction of incorrectly converted digital data because of the occurrence of missing codes in the internal DAC. The corrector does not require the use of memories and/or analog circuits and is very cost-effective and permits a greatly improved production yield of complex devices containing ADCs.

19 Claims, 7 Drawing Sheets

DIGITAL CORRECTION FOR MISSING CODES CAUSED BY CAPACITIVE MISMATCHINGS IN SUCCESSIVE APPROXIMATION ANALOG-TO-DIGITAL CONVERTERS

CROSS-REFERENCE TO RELATED APPLICATION

This application claims priority from EP 93830503.4, filed Dec. 15, 1993, which is hereby incorporated by reference. However, the content of the present application is not necessarily identical to that of the priority application.

BACKGROUND AND SUMMARY OF THE INVENTION

The present invention relates to methods and devices for verifying and correcting data resulting from analog to digital conversion through a so-called successive approximation technique, employing an analog-digital converter (ADC) liable to introduce an error of a certain entity because of the process spread or of other imprecisions in its circuit.

Analog-to-digital converters (ADC) are of fundamental importance in control, regulation, data collection and processing systems. They constitute conversion interfaces of analog entities (real-world parameters) into digital data that can be easily processed by digital circuits, such as combinative logic networks, memories, microprocessors and the like. Among these, analog-to-digital converters (ADC) that are based on successive approximation steps cover a large portion of applications.

In successive approximation ADCs, an analog input voltage is compared with a voltage that is synthesized by an internal digital-to-analog converter (DAC) contained within the ADC converter. A digital input to said internal DAC is provided by a register (SAR) that stores the current digital value of the successive approximation process, which is updated step by step depending on the result of the last comparison carried out. After a number of comparisons (which may be equal to or greater than the number of bits handled by the converter), the data stored in the SAR register represents the digital result of the completed conversion.

Commonly, at the start of any new conversion process, a certain code or digital value, for example 100···0, that may represent the intermediate code (value or digital data) as referred to the range of convertible digital values, is provided to the internal DAC. This is effected by "setting" the SAR to such an intermediate value. The result of a first comparison will define the successive content of the SAR which may become for example either 110···0 or 0100···0, and therefore, through successive bisections, the code or digital data that represents the converted input analog value will be reached, within the theoretical approximation limit defined by the number of bits of the converter.

Figure 1:
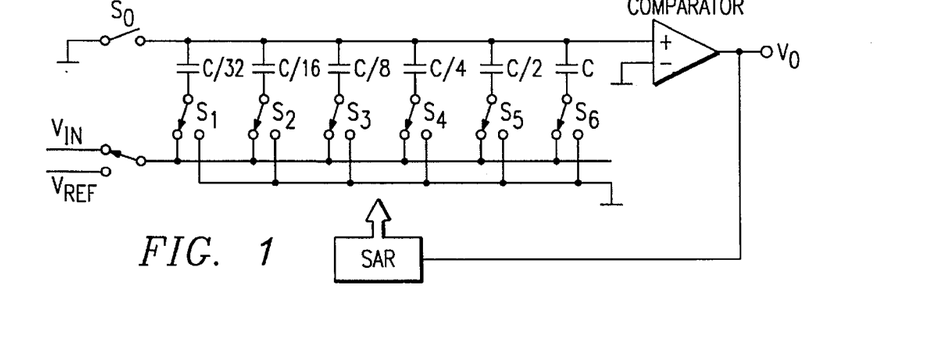
FIG. 1 is a circuit diagram of a successive approximation ADC, as already described above.

FIG. 1 is a functional diagram of a successive approximation ADC. As may be observed, the internal DAC may be constituted by an array of capacitances: C, C/2, C/4, C/8 and C/16, that performs a capacitive partition of a reference voltage VREF in order to produce an analog value corresponding to the digital code stored in the SAR.

Practically, a capacitance is associated with each bit of the SAR, the capacitance associated with the first bit (MSB or Most Significant Bit) is twice the capacitance that is associated with the second bit, which is twice the capacitance associated with the third bit and so forth, until the so-called LSB (Least Significant Bit). Therefore the analog value produced by the code 0100···0 is double the value that would be produced with the digital code 0010···0 and half the value corresponding to the code 1000···0.

A main cause of problems in this type of converter is capacitive mismatching, that is an imprecise ratio among the values of the various capacitances that compose the internal DAC, which causes an incorrect conversion of the current digital value stored in the SAR register in an analog value (by capacitive partitioning of a VREF).

The capacitance per unit area of an integrated circuit capacitor is fairly unpredictable. This is because the capacitance is sensitively affected by such factors as the background doping, the degree of drive performed for well doping, the location of the peak of any VT-adjust implant, the exact thickness of the gate oxide, and the density of fixed charge in the oxide and at the oxide interfaces, etc.

In addition, the capacitance of an integrated circuit capacitor will not be a strictly linear function of the capacitor's designed area. This is true for several reasons. First, the capacitance is determined not only by the homogeneous area in the center of the capacitor plate, but also by the trenching areas at the perimeter of the capacitor plate. These perimeter elements do not scale with area, but rather linearly (i.e. as the square root of area). Moreover, the importance of these perimeter capacitances in relation to the central capacitances may itself be affected by the process variable mentioned above. Moreover, the capacitances at the corners of a rectangular capacitor will themselves scale differently from the straight-line perimeter capacitance. Moreover, linewidth variation in processing will also affect the areas of different capacitors differently.

For example, it may occur that, because of an incorrect ratio of capacitances between the various capacitors that compose the internal DAC, the voltage level or analog value that is associated with a digital code, e.g. 100···0, is lower than the analog value corresponding to the digital code 011···1.

Figure 2A:
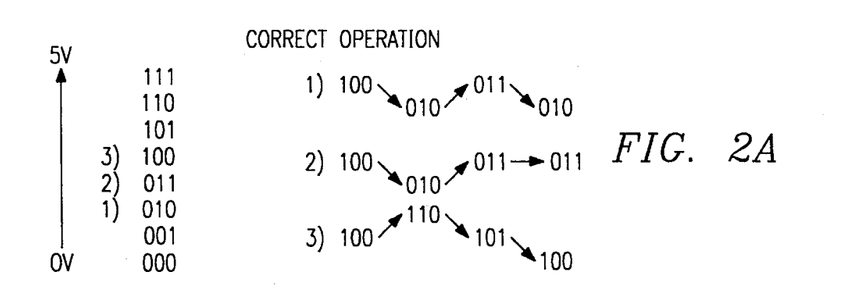
FIGS. 2A and 2B are operation schemes of a three-bit ADC converter, correct and incorrect because of the existence of a missing code, respectively.
Figure 2B:
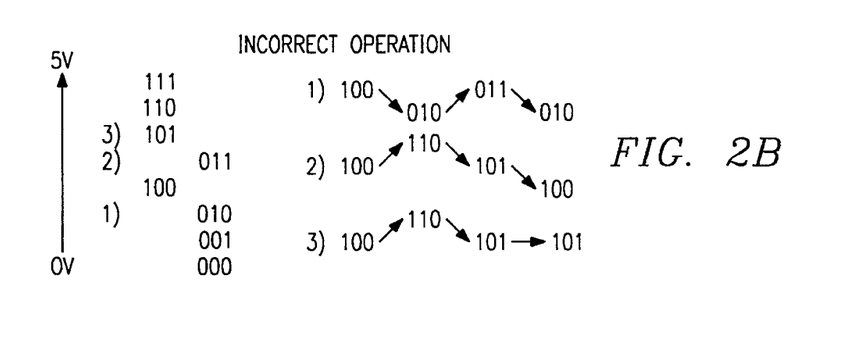

In such a situation, a so-called "missing code" phenomenon occurs, that is the digital code 011···1 will never be converted by the internal DAC. Such an operating condition, that may be due to process variation or to some other defect that may have altered the correct design capacitance ratio, is illustrated in FIG. 2B by direct comparison with a correct operating condition illustrated in FIG. 2A. For simplifying the illustration, the schemes refer to the case of a three-bit converter (that is every conversion implies the execution of three comparisons), and show three distinct conversion processes for three different values or codes (010, 011 and 100) representing three different levels in a voltage scale from 0 V to 5 V (as schematically depicted on the right hand side of the conversion schemes). In the case shown in FIG. 2B, the occurrence of a capacitive mismatching causing an impossibility of converting correctly the code 011 by the internal DAC is shown.

Of course, it may also occur that the so-converted level 100···0 is lower than the level 011···10, that is the mismatching of the capacitance ratio may be so marked as to cause the disabling of two adjacent digital codes (values) or even more.

Various remedies have been studied and proposed for recovering the functionality of complex integrated circuits containing one or more ADC converters that have revealed themselves defective in the above-noted manner. This has been achieved by suitably modifying the operating characteristic of the internal DAC that has been recognized as defective through a series of specific functionality tests, by the use of dedicated analog circuits (amplifiers, track-and-hold circuits and the like, associated with EPROMs that may be programmed through a correction test and trimming process, and/or ROMs). These known correction systems are relatively complex and greatly penalize the economy of the whole integrated circuit.

Digital correction techniques, based on the generation of redundant codes that may be employed for effecting a digital correction capable of re-establishing the functionality of the internal DAC are also known. These correction systems, though not requiring the integration of analog circuits, require the use of RAM and/or EPROM memories capable of storing the necessary information for performing one or more correction procedures during the conversion process. As an alternative to the use of dedicated memories, the correction may also be performed automatically, by the use of an appropriate algorithm, in function of the redundant bits that are generated.

In general, the procedures for detecting missing codes and for correcting a defective converter are relatively complex and require the realization of arrays of trimming elements or the use of a plurality of internal DACs and memories.

The volume: "Design of CMOS Analog Integrated Circuits" by F. Maloberti, 1986, Section 8, pages 37–60, contains a brief description of various correction techniques. Several of these techniques also permit reduction of the so-called unadjusted total error (TUE), which accounts also for the input offset of the ADC converter.

In a large number of integrated devices containing successive approximation ADCs, e.g. in many microcontrollers, the device specifications may not be particularly stringent as far as TUE is concerned; for example they may accept a TUE equal to ±2LSB, but they are typically intolerant of missing codes.

Moreover, by analyzing the causes that determined the rejection of a certain percentage of fabricated devices, it may be found that for about 90% of the rejected devices, the cause consisted of a missing code. By analyzing further the rejected devices, a typical "breakdown" of causes may reveal that about 60–70% of the rejections are due to a single missing code occurrence, about 28–38% of rejects are due to the presence of a double missing code, while a residue of about 2% denounces a triple missing code, notwithstanding the fact that a percentage of over 90% of all the rejected devices satisfy the specifications as far as TUE is concerned.

Therefore, there is an evident need and/or utility for a correction method for missing code, imputable to capacitive mismatching in an internal DAC of a successive approximation ADC, easy to implement by employing exclusively logic circuitry, that practically will avoid the rejection of a relatively large percentage of devices because of the occurrence of a missing code, almost exclusively due to capacitive mismatching in the internal DAC, while satisfying the specifications for what concerns the total unadjusted error (TUE).

This objective is fully satisfied by the system of the present invention that can be implemented without requiring the use of memories or of analog circuits for altering the analog structure of the internal DAC. The system of the invention is theoretically capable of correcting also plural missing codes. The eventual choice of implementing in a certain device a "corrector" for a single missing code, for a double missing code or for more than two missing codes, will depend on the yield characteristics of the particular fabrication processes of the device. From the percentages that emerge from an analysis of a typical production, as reported above, it would appear that an optimum design choice would imply the implementation of a corrector, according to the present invention, capable of correcting as far as two adjacent missing codes. This would permit "recovery" to a perfect functionality what would otherwise be, by far, the largest proportion of rejected devices. The occurrence of adjacent missing codes in a number greater than two is statistically not very significant or, whenever it becomes statistically significative, it may almost certainly be an indication that serious problems have occurred in the fabrication process, the occurrence of which would normally tend to bring out of specification limits many other parameters, even less critical than the capacitive mismatching in DACs.

Of course, the correction process of the invention, for example for a double missing code, will require the performing of three further comparisons beyond those necessary to the normal conversion process and, in view of the fact that each comparison requires a certain execution time (for example of about 800 ns), the correction procedure implies an increase of the conversion time of about 2–3 microseconds. On the other hand, it is often the case in microcontrollers that the circuits dedicated to the analog-to-digital conversion be amply "margined", i.e. they are often structurally capable of operating (as stand-alone circuits) correctly at clock frequencies that may be well above those actually used by the system, and, in such a frequent case, it is possible, by suitably modifying the timing signals of the converter, to maintain the same conversion times, without requiring any redesigning of the analog part of the comparator circuit.

The correction process, for the case of implementing a corrector for a single missing code, consists of the following steps:

a) decrementing by an LSB the digital data produced by the conversion process and stored in the SAR;

b) converting the decremented digital value stored in the SAR into an analog value;

c) comparing said converted analog value with the input analog value;

d) incrementing the digital value stored in the SAR by an LSB if the analog value corresponding to the converted digital value is less than said input analog value;

e) using the digital value stored in the SAR as a correct digital result of the analog-digital conversion of said input analog value.

In case of implementing a corrector for a double missing code, the process consists of the following steps:

a) decrementing by two LSBs the digital data produced by the conversion process and stored in the SAR;

b) converting the digital data stored in the SAR in an analog value;

c) comparing said converted analog value with the input analog value;

d) incrementing by an LSB the digital value stored in the SAR if the analog value corresponding to the converted digital value is less than said input analog value;

e) repeating the steps b), c) and d);

f) incrementing the digital value stored in the SAR by two LSBs;

g) repeating the steps b) and c);

h) decrementing the digital value stored in the SAR by two LSBs if the analog value corresponding to the converted digital value is greater or equal to said input analog value or decrementing by one LSB the digital value stored in the SAR if the analog value corresponding to the converted digital value is less than said input analog value;

i) using the digital value stored in the SAR as corrected digital result of the analog-digital conversion of said input analog value.

BRIEF DESCRIPTION OF THE DRAWING

The disclosed inventions will be described with reference to the accompanying drawings, which show important sample embodiments of the invention and which are incorporated in the specification hereof by reference, wherein.

The different aspects and advantages of the invention will become more evident through the following description of several important embodiments and by referring to the attached drawings and diagrams, wherein.

With reference to the scheme of FIG. 2B, it should be observed that in this particular example the code 011 is not converted giving rise to a so-called missing code situation.

DETAILED DESCRIPTION OF THE PREFERRED EMBODIMENTS

Figure 3:
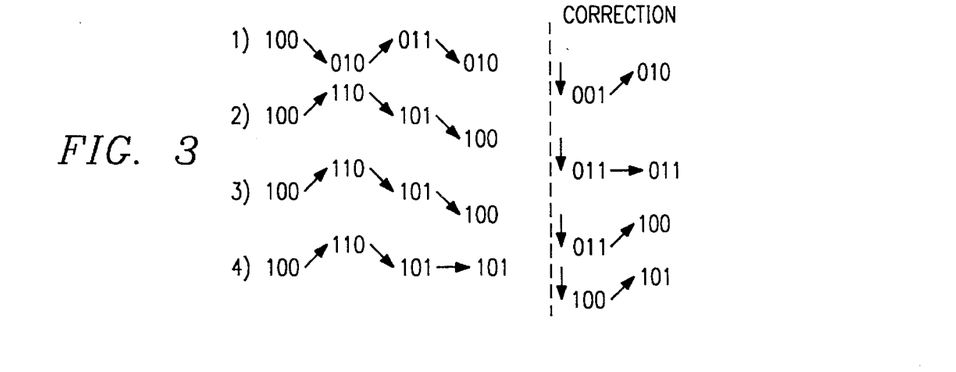
FIG. 3 depicts the correction process of the invention of a data produced by a three-bit ADC denouncing the presence of a single missing code.

The numerous innovative teachings of the present application will be described with particular reference to the presently preferred embodiment (by way of example, and not of limitation), in which:

According to the present invention, in an ADC there is implemented a correction process that is schematically depicted in FIG. 3 (for four examples of conversions of as many different codes) and which leads to the conversion by the internal DAC of also the missing code 011 (as denounced by the DAC of FIG. 2B).

Basically, at the end of each conversion cycle, the digital data produced by the conventional conversion process, stored in the SAR, is decremented by one LSB (Least Significant Bit). The decremented digital value is again converted into an analog value by the internal DAC and the resulting analog value is compared with the input analog value, object of the conversion process. Only if the analog value corresponding to the decremented and converted digital value is less than the input analog value, the digital data stored in the SAR is incremented by one LSB. Viceversa, if the converted analog value is equal or greater than the input analog value, the digital data present in the SAR is no longer modified. As may be observed in FIG. 3, the result of the correction process at the end of a conversion cycle is that also an eventual missing code (011) is virtually converted.

Figure 4:
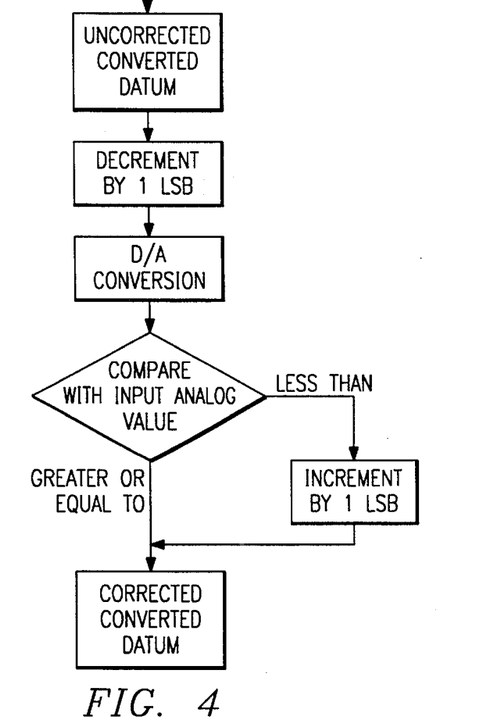
FIG. 4 is a flow-chart of the correction process for a single missing code.

The correction process for the case of a corrector for single missing code described above is depicted also in the form of a flow-chart in FIG. 4.

Figure 5:
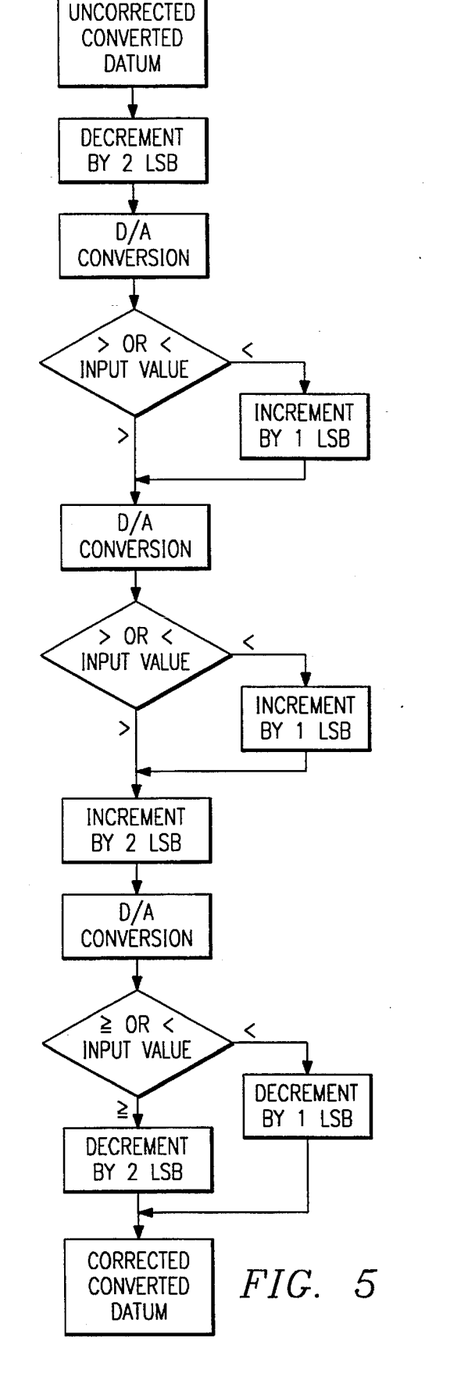
FIG. 5 is a flow-chart of the correction process for two adjacent missing codes.

If a corrector capable of correcting two adjacent missing codes must be implemented, the correction process becomes the one depicted in the form of a flowchart in FIG. 5.

Figure 6:
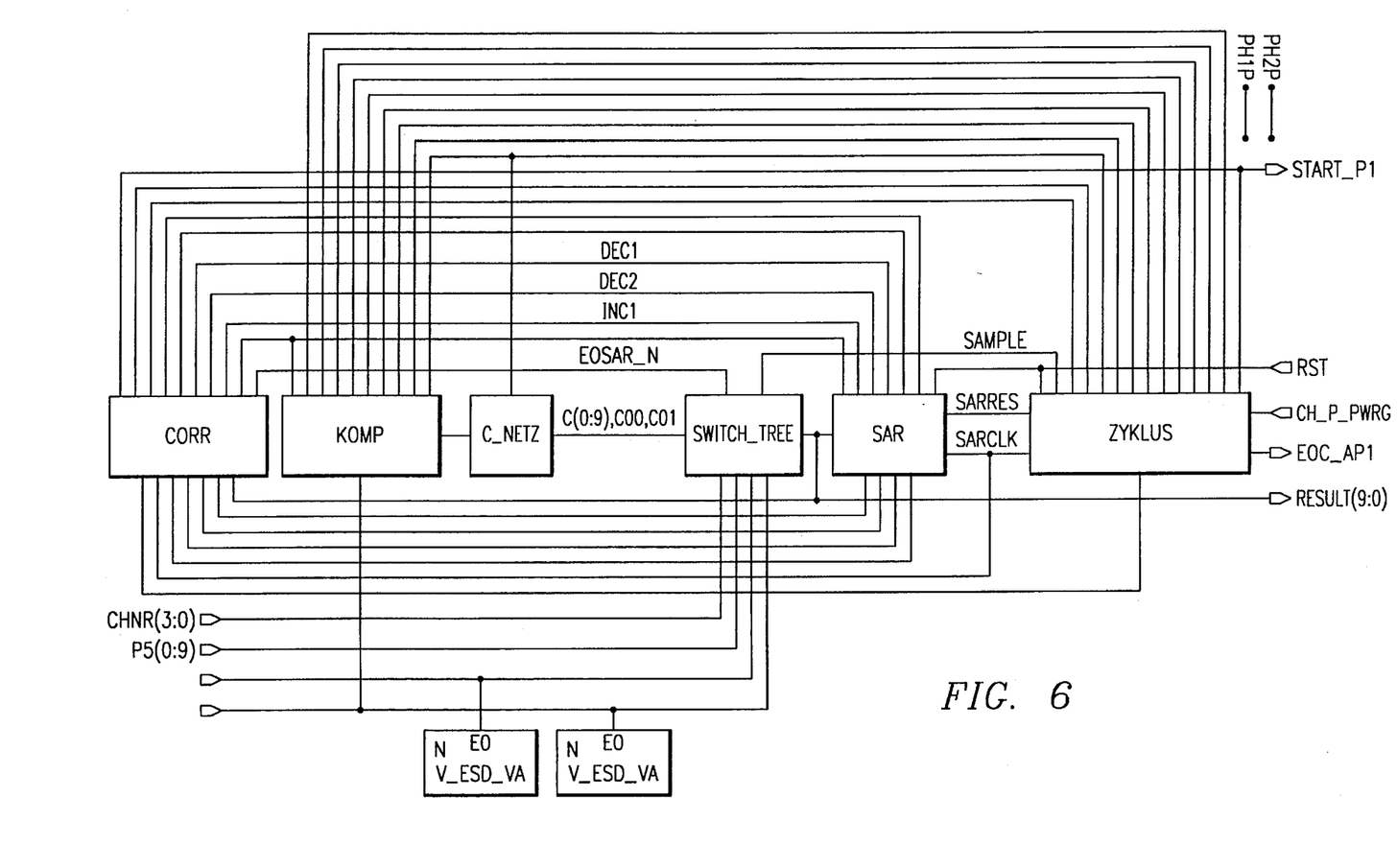
FIG. 6 is a block diagram of a successive approximation ADC provided with a corrector according to the present invention.

FIG. 6 is a block diagram of a successive approximation ADC made according to the present invention. As compared with a conventional architecture, the converter is provided with an additional block, CORR, containing the logic circuitry that implements the correction routine. The block KOMP performs the comparison between an input analog voltage and an analog voltage synthetised by the internal DAC and which corresponds to the current digital value stored in the SAR. The array of capacitors for partitioning a reference voltage is contained in the block C_NETZ, while the array of switches for configuring the capacitor array is contained in the block named SWITCH_TREE, which is driven by the block SAR.ZYKLUS, a dedicated sequencer that generates all the timing signals used in the converter.

Of course, according to the present invention, the architecture of the SAR integrates additional logic circuits capable of performing the decrementing and incrementing functions of the digital data stored in the SAR, according to the correction process of the invention, whether it is implemented for correcting a single missing code or for the correction of two or more adjacent missing codes, under the control of the supervising block CORR.

Figure 7:
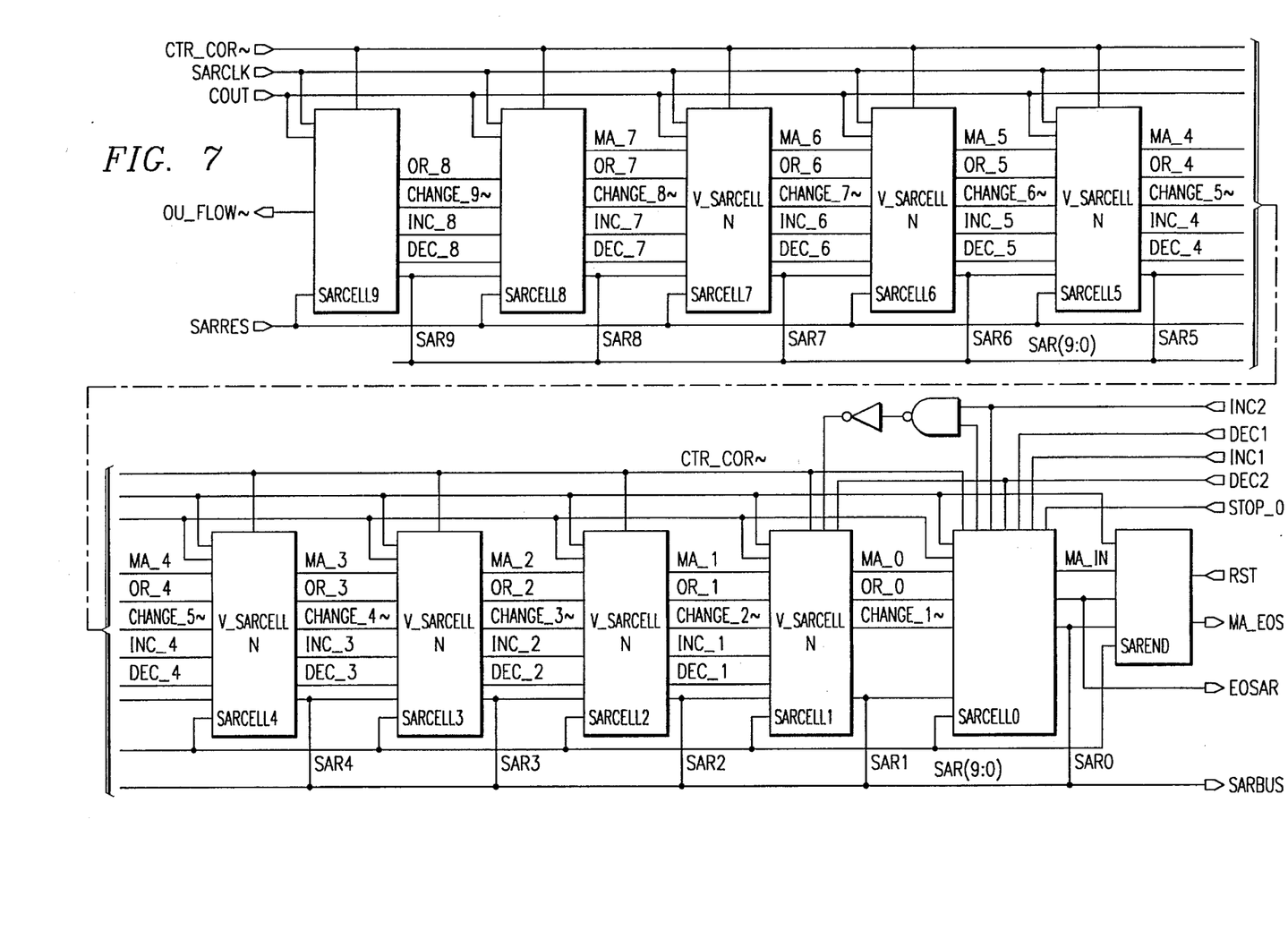
FIG. 7 is a partial circuit diagram showing the architecture of the SAR of the ADC of FIG. 6, composed of special cells (V_SARCELL) provided with incrementing and decrementing logic circuitry driven by a control circuit that supervises execution of the correction routine.

A circuit diagram of a ten-bit SAR block of an ADC of the invention of FIG. 6 is shown in FIG. 7. As in the case of a conventional SAR, to all the ten cells, SARCELL0/ . . . SARCELL9, is input the COUT signal that represents the output signal of the comparator KOMP and which therefore carries the information relative to the performed comparison, which, depending on its value, update the digital data stored in the SAR. Also in a modified SAR of the converter of the invention, the same function is performed through the signal COUT, for the first ten comparisons (being the comparator taken into a consideration a ten-bit comparator). At the end of the ten comparisons, the digital data stored in the SAR is updated by means of an increment or a decrement signal, provided by the control block CORR through the signals: INC2, INC1, DEC2, DEC1, STOP_0, RST, CTR_CORR≈.

Figure 8:
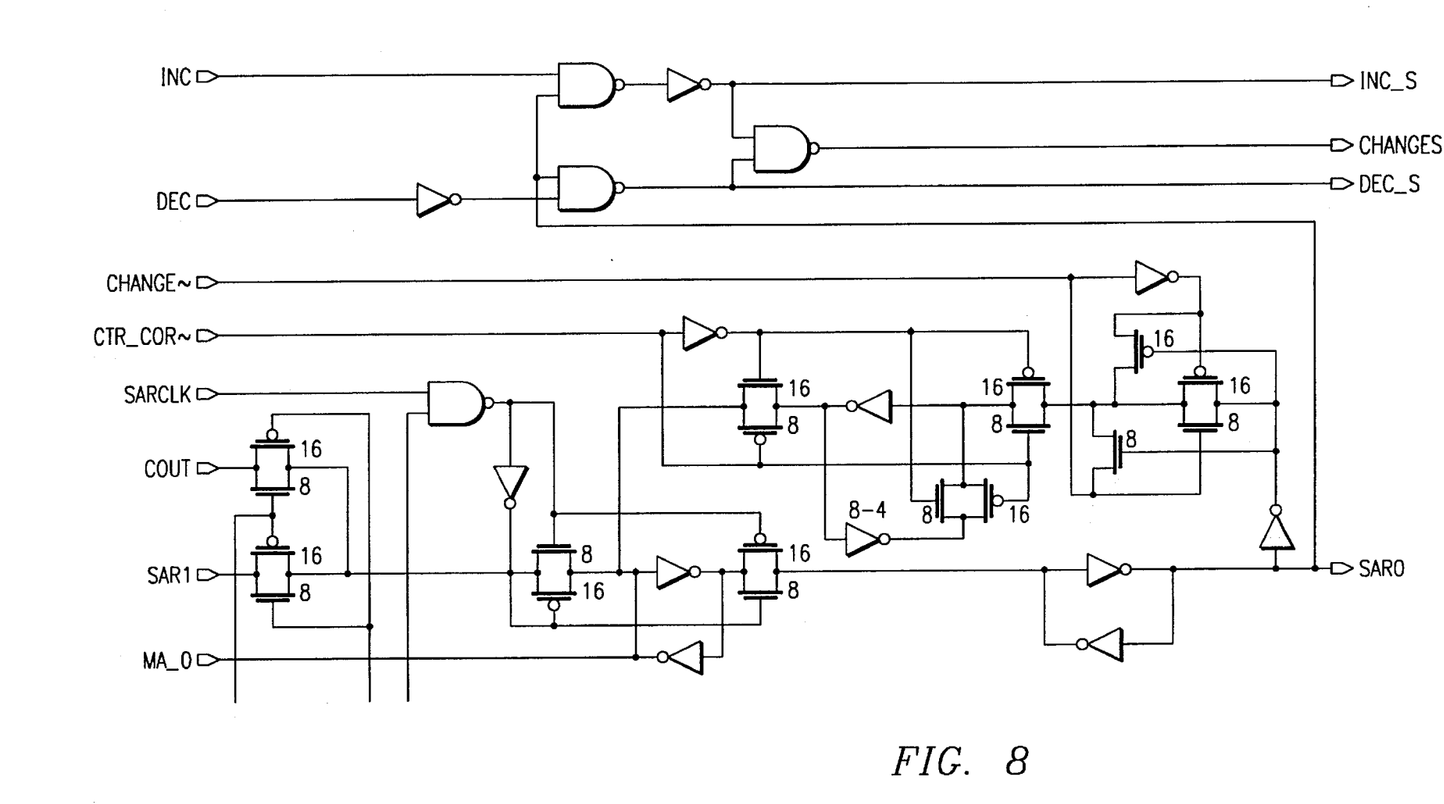
FIG. 8 shows a circuit diagram of V_SARCELL of the SAR of FIG. 7.

The single cells, SARCELL(*), may have the structure depicted in FIG. 8. Purely for illustrative purposes, the circuit of a cell of a known design, modified in order to implement the corrector system object of the present invention, is shown.

Basically, the single cells may be provided with an additional circuitry constituted by the upper portion of the circuit diagram of FIG. 8, which is identified by confining the added circuitry into a dash-line perimeter, to distinguish it from the lower portion of the cell circuit that represents the circuit of a substantially standard cell. In practice, in a "retrofit design situation", a dedicated circuit (upper portion of the circuit of FIG. 8) may be added in order to substantially realize a so-called Master latch of the register cell, in an appropriately modified form (in substitution of the preexisting, standard, Master latch of the cell), provided with incrementing and decrementing devices of a stored logic value.

With reference to the circuit shown in FIG. 8, the INC signal practically informs the depicted cell (SARCELL1 of the SAR), that the preceding cell (SARCELL0/) has been updated pursuant to an incrementing operation. Vice-versa, the signal DAC informs that the preceding cell has been updated pursuant to a decrementing operation.

The signal CHANGE≈ operates a change of the logic content of the depicted cell, while the output signal CHANGES≈ is the signal that is activated when it is necessary to modify the content of the successive cell (SARCELL2).

For example, if both the signals CHANGE≈ and INC are activated, this means that an increment operation is being performed and that the content of the cell must be changed. If a logic "0" is stored in the cell, the value is changed to a logic "1" and the signal for changing the value stored in the next cell, that is the signal CHANGES≈, is not activated; vice-versa, if a "1" is stored in the cell, the value is changed to "0" and the signal CHANGES≈ for changing value of the next cell is activated.

Once the operation has been performed, the result is stored in the Master latch of the cell. The so stored value in the Master latch of the cell is conditionally transferred to the Slave latch of the same cell (in order to update the data stored in the SAR) only if the signal CTR_CORR≈ enables the writing of the result of the operation. This is necessary because the decrementing or incrementing steps are always performed at the end of every conversion cycle and only when necessary (on the basis of the result of the comparison), the result of the operation is effectively written in the SAR. The logic operator that permits to perform the incrementing and decrementing operations may be a classical XNOR circuit, as depicted in FIG. 8. Of course, in case of a completely new design, the single cells of the SAR may also be realized with a different circuit from the one shown in the figure and their circuit may be optimized in terms of the total number of transistors required.

Also the cells SARCELL0/, SARCELL8 and SARCELL9 have a circuit that is functionally similar to that of the other cells, except for the absence of certain input and/or output terminals. The SAREND block, that is normally present in a common SAR architecture, serves to close a comparison cycle. Also in the case of the modified SAR register of the invention, the function of the SAREND block is the same, that is that of determining the termination of a comparison and correction cycle. The signals MA_EOS and EOS_AR are input to the control block CORR, which supervises the execution of the correction steps at the end of each conversion process, for commanding the termination of the cycle.

In a practical design, implementing the correction system of the invention for two adjacent missing codes, in an eight-bit ADC, the total number of "gates" used was 2002, as compared with a total number of gates of 1576 that was required by the ADC converter without correction system.

Figure 9A:
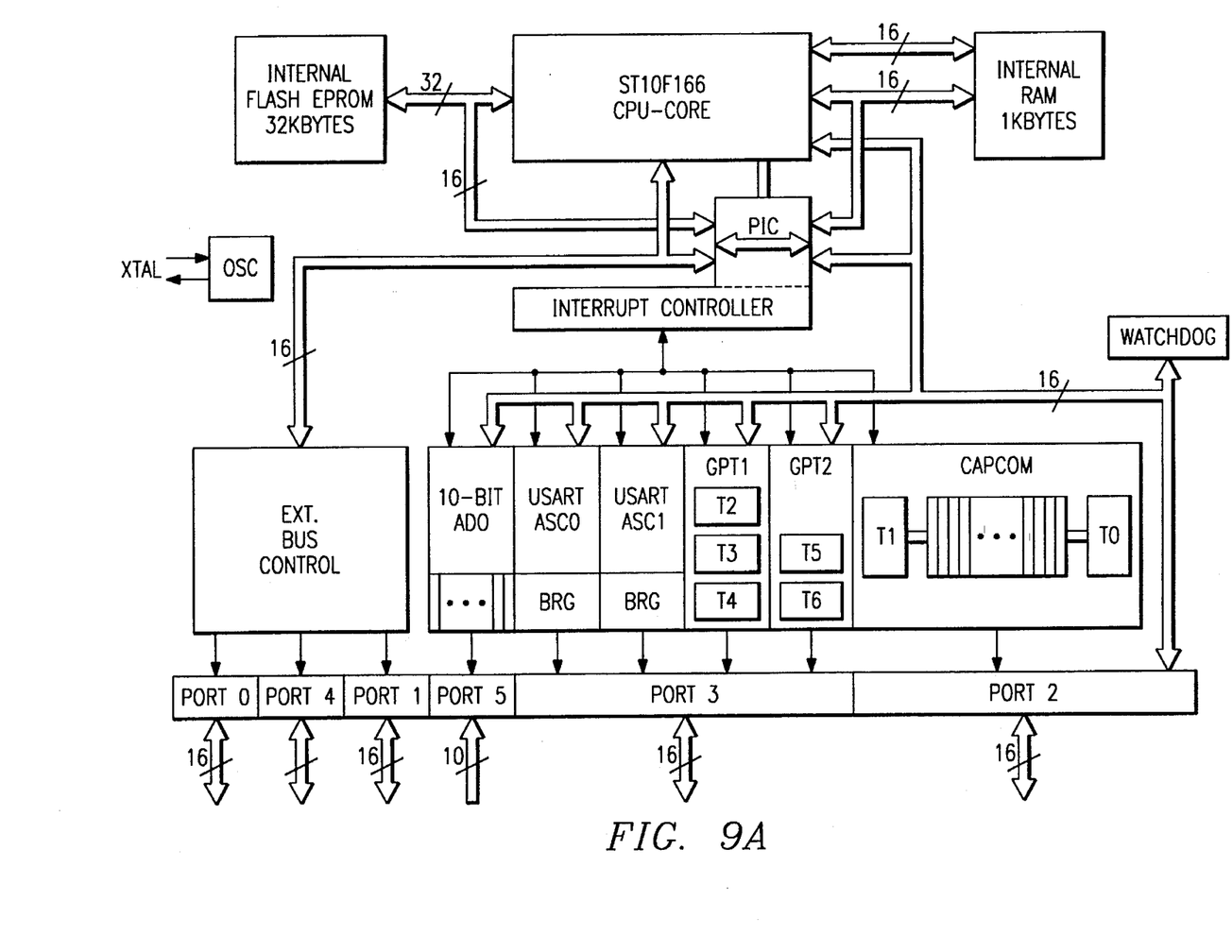
FIGS. 9A and 9B show high-level diagrams of an SGS-Thomson chip, the ST10 microcontroller, in which the present invention has been incorporated.
Figure 9B:
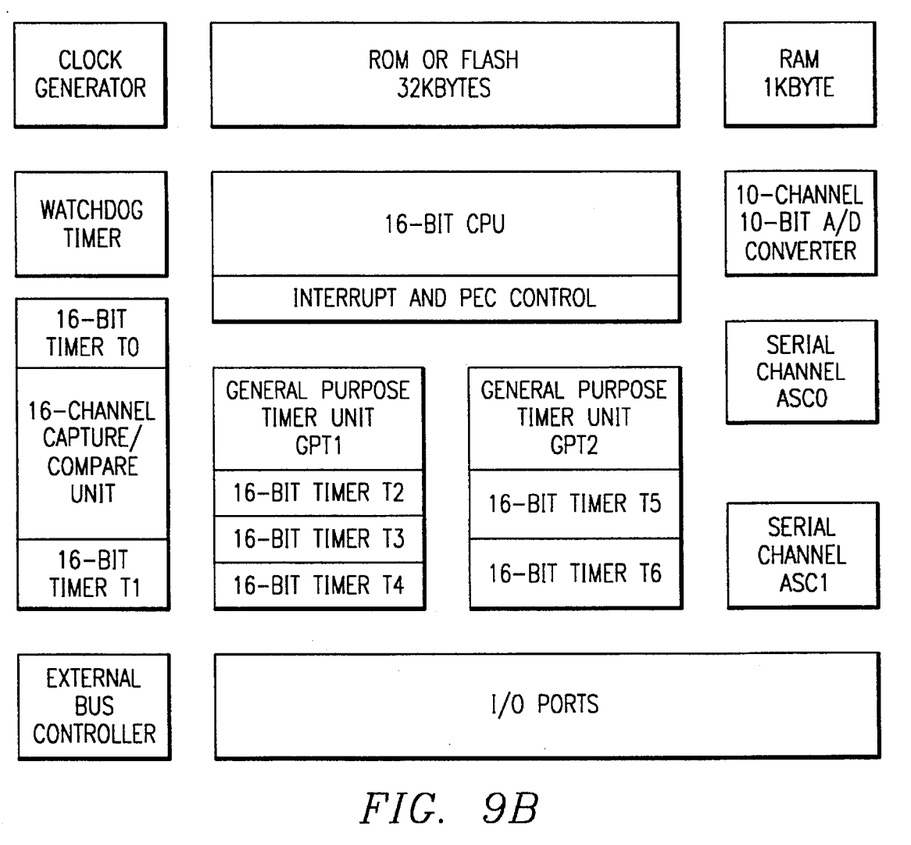

FIG. 9A shows a block diagram and 9B a functional diagram of a microcontroller using an analog-to-digital converter as described herein. Block 90 in each diagram is the ADC which uses the claimed invention.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For example, although the examples shown used a one-bit-at-a-time successive approximation architecture, the invention is not limited to this case. For example, such a method could use flash conversion to obtain an initial estimate of the first three or four bits.

For another example, the method could be implemented by using steps of increment-and-test, rather than decrement-and-test, with appropriate adjustments as needed depending on the type of analog comparison being performed.

For another example, the method could used by introducing an initial increment operation before carrying out the decrement operation.

What is claimed is:

1. A method for performing accurate analog-to-digital conversion, comprising the steps of:
    (a.) performing an initial analog-to-digital conversion on an analog signal to provide a first converted digital value at a first resolution;
    (b.) adjusting said digital first converted value by one least significant bit thereof, to produce an adjusted digital value at the same said first resolution as said first converted digital value;
    (c.) reconverting said adjusted digital value to produce a converted analog signal, and comparing said converted analog signal with said analog input;
    (d.) outputting said first converted digital value IF said comparison step indicates that said first converted value was accurate, and outputting said adjusted converted value otherwise.

2. The method of claim 1, wherein said adjusting step comprises incrementing.

3. The method of claim 1, wherein said adjusting step comprises decrementing.

4. The method of claim 1, wherein said step of initial analog-to-digital conversion comprises successive-approximation conversion.

5. A method comprising the steps of:
    (a.) performing an initial analog-to-digital conversion on an analog signal to provide a first converted digital value at a first resolution;
    (b.) adjusting said first converted digital value by a multiple of a least significant bit thereof, to produce an adjusted digital value at the same said first resolution as said first converted digital value;
    and thereafter repeatedly:
        (i.) testing said adjusted value to see if said adjusted value is a correct approximation to the analog input, and
        (ii.) depending on the result of said testing substep (i.), either
            outputting said adjusted value, or
            adjusting said adjusted value again, opposite to the direction of said initial adjustment thereof, if said adjusted value is not within one least-significant-bit of the initial approximation, and
        (iii.) repeating said substeps (i.)–(ii.) for a number of times which is at least equal to said multiple.

6. The method of claim 5, wherein said adjusting step comprises incrementing.

7. The method of claim 5, wherein said adjusting step comprises decrementing.

8. The method of claim 5, wherein said step of initial analog-to-digital conversion comprises successive-approximation conversion.

9. A microcontroller operating at a first clock rate, comprising
an analog-to-digital converter which operates at a second clock rate, said second clock rate being faster than said first clock rate, said analog-to-digital converter comprising:
first conversion circuitry to receive an analog signal, perform an initial analog-to-digital conversion on said analog signal and to store a first converted digital value in a register;
circuitry to adjust said value in said register by one least significant bit thereof, to produce an adjusted digital value;
second conversion circuitry connected to reconvert said adjusted digital value to produce a converted analog signal;
circuitry connected to compare said converted analog signal with said analog input;
an output circuit connected to output said first converted digital value IF said comparison step indicates that said first converted value was accurate, and outputting said adjusted converted value otherwise.

10. A correction process for a single missing code of a digital data produced by a conversion process of an input analog value in a digital value through successive approximations, performed in an ADC comprising an internal DAC, a comparator and a successive approximation register (SAR), said DAC converting into an analog value, a digital value stored in the SAR, which, compared with said input analog value, determines an updating in an incrementing or in a decrementing direction of the digital data present in the SAR, the process being repeated for a number of times equal at least to the number of bits of said SAR, characterized by comprising the following steps:
a) decrementing by an LSB the digital data produced by the conversion process and stored in the SAR;
b) converting the decremented digital value stored in the SAR into an analog value;
c) comparing said converted analog value with the input analog value;
d) incrementing the digital value stored in the SAR by an LSB if the analog value corresponding to the converted digital value is less than said input analog value;
e) using the digital value stored in the SAR as a correct digital result of the analog-digital conversion of said input analog value.

11. A correction process for a double missing code of a digital data produced by a conversion process of an input analog value in a digital value through successive approximations, performed in an ADC comprising an internal DAC, a comparator and a successive approximation register (SAR), said DAC converting into an analog value, a digital value stored in the SAR, which, compared with said input analog value, determines an updating in an incrementing or in a decrementing direction of the digital data present in the SAR, the process being repeated for a number of times equal at least to the number of bits of said SAR, comprising the following steps:
a) decrementing by two LSBs the digital data produced by the conversion process and stored in the SAR;
b) converting the digital data stored in the SAR in an analog value;
c) comparing said converted analog value with the input analog value;
d) incrementing by an LSB the digital value stored in the SAR if the analog value corresponding to the converted digital value is less than said input analog value;
e) repeating the steps b), c) and d);
f) incrementing the digital value stored in the SAR by two LSBs;
g) repeating the steps b) and c);
h) decrementing the digital value stored in the SAR by two LSBs if the analog value corresponding to the converted digital value is greater or equal to said input analog value or decrementing by one LSB the digital value stored in the SAR if the analog value corresponding to the converted digital value is less than said input analog value;
i) using the digital value stored in the SAR as the corrected digital result of the analog-digital conversion of said input analog value.

12. An ADC comprising an internal DAC driven by a successive approximation SAR and a comparator suitable to compare an input analog value with an analog value generated by said internal DAC by capacitive partition of a reference voltage and corresponding to a digital value stored in said SAR, and to produce a confirmation, or a decrement or an increment logic signal of the digital value stored in said SAR, the process being repeated for a number of times at least equal to the number of bits of said SAR, and further comprising a correction logic circuit capable of controlling the performance of a correction routine and the end of which conversion routine; and
a circuit, responding to said correction circuit, capable of modifying the digital value contained in said SAR by at least one LSB.

13. An ADC as defined in claim 12, wherein each cell of said SAR is constituted by a bistable Master-Slave type circuit; a Master latch of the cell being provided with circuit means, responsive to said correction logic circuit, capable of modifying the digital value stored in the Master register and of conditionally transferring said modified bit in a Slave latch of the cell for modifying the digital data stored in the SAR register.

14. A converter according to claim 13, wherein said circuit means capable of modifying the digital value stored in said Master latch comprise an XNOR circuit.

15. The microcontroller of claim 9, wherein said value in said register is incremented to produce said adjusted digital value.

16. The microcontroller of claim 9, wherein said value in said register is decremented to produce said adjusted digital value.

17. The microcontroller of claim 9, wherein said analog-to-digital converter uses successive-approximation conversion.

18. The microcontroller of claim 9, wherein if said comparison step does not indicate that said first converted value was accurate, then said circuitry to adjust said value adjusts said adjusted digital value to produce a new adjusted digital value.

19. The microcontroller of claim 9, wherein said register is a successive-approximation register.

* * * * *